United States Patent [19]
Gardner et al.

[11] Patent Number: 6,010,957
[45] Date of Patent: Jan. 4, 2000

[54] SEMICONDUCTOR DEVICE HAVING TAPERED CONDUCTIVE LINES AND FABRICATION THEREOF

[75] Inventors: Mark I. Gardner, Cedar Creek; Daniel Kadosh, Austin, both of Tex.

[73] Assignee: Advanced Micro Devices, Austin, Tex.

[21] Appl. No.: 08/882,423

[22] Filed: Jun. 25, 1997

[51] Int. Cl.$^7$ .............................................. H01L 21/283
[52] U.S. Cl. ...................... 438/624; 438/640; 438/623; 438/673; 438/701
[58] Field of Search ...................... 438/624, 639, 438/701, 668, 633, 623, 640, 673, 695; 148/DIG. 51

[56] References Cited

U.S. PATENT DOCUMENTS

| | | | |
|---|---|---|---|
| 4,363,830 | 12/1982 | Hsu et al. ................................. | 438/701 |
| 4,906,592 | 3/1990 | Merenda et al. ......................... | 438/624 |
| 5,338,955 | 8/1994 | Tamura et al. ........................... | 257/308 |
| 5,395,801 | 3/1995 | Doan et al. ............................... | 438/633 |
| 5,424,247 | 6/1995 | Sato ......................................... | 438/639 |
| 5,445,996 | 8/1995 | Kodera et al. ........................... | 438/633 |
| 5,451,551 | 9/1995 | Krishnan et al. ........................ | 438/633 |
| 5,565,384 | 10/1996 | Havemann ...................... | 148/DIG. 51 |
| 5,635,428 | 6/1997 | Martin et al. ............................ | 438/624 |
| 5,651,857 | 7/1997 | Cronin et al. ......................... | 156/644.1 |
| 5,665,643 | 9/1997 | Shin ......................................... | 438/624 |
| 5,728,608 | 3/1998 | Su et al. ................................... | 438/701 |
| 5,728,628 | 3/1998 | Havemann ............................... | 438/668 |
| 5,783,488 | 7/1998 | Bothra et al. ............................ | 438/692 |

OTHER PUBLICATIONS

S. Wolf, "Silicon Processing for the VLSI Era vol. 1—Process Technology", p. 273, 1986.

S. Wolf, "Silicon Processing for the VLSI Era vol.2—Process Integration," pp. 188–217, 240–260, and 334–337, copyright 1990.

*Primary Examiner*—Brian Dutton
*Assistant Examiner*—Maria Guerrero
*Attorney, Agent, or Firm*—Merchant & Gould P.C.

[57] ABSTRACT

A semiconductor device and fabrication process in which tapered conductive lines are formed. Consistent with one embodiment of the invention, a semiconductor device is formed by forming at least one conductive structure over a substrate and forming an insulating layer over the conductive structure. The insulating layer is provided with one or more tapered grooves separated from the conductive structure by a portion of the insulating layer. In each tapered groove a conductive line is formed. The conductive lines may, for example, be metal lines. The conductive structures may, for example, be active regions of a transistor or a previously formed conductive line. A portion of the insulating layer between the conductive layers may be a low dielectric material.

32 Claims, 4 Drawing Sheets

SEMICONDUCTOR DEVICE HAVING TAPERED CONDUCTIVE LINES AND FABRICATION THEREOF

FIELD OF THE INVENTION

The present invention is directed generally to semiconductor devices and methods of manufacture and, more particularly, to a semiconductor device having tapered conductive lines.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors, etc.

Each of these semiconductor devices generally include a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

A typical semiconductor substrate includes a large number of transistors which are interconnected using one or more layers of metal. FIG. 1 illustrates an exemplary multilevel-interconnect structure for MOS technologies. The interconnect structure illustrated in FIG. 1 includes two metal layers 101 and 102. The first metal layer 101 generally interconnects active portions of the transistors, such as the gate electrode 105 and the source/drain region 104. Each subsequent metal layer, such as second metal layer 102, typically interconnects regions of the previously formed metal layer. Dielectric layers 106 and 107 are provided between conductive structures, such as the metal layers 101 and 102, the gate electrode 105, and the source/drain region 104 in order to isolate these structures from one another. Openings or vias 108 in the dielectric layers 106 and 107 are used to interconnect these structures as desired. A more detailed description of metal layers and the fabrication thereof may be found in S. Wolf, *Silicon Processing for the VLSI Era*, Vol. 2: Processing Integration, pp. 188–217, 240–260 and 334–337.

One important characteristic of interconnect structures is that capacitance between metal lines is kept to a minimum. It should be appreciated that high capacitance between metal lines can deleteriously affect the speed of a semiconductor device. Two factors affecting such capacitance are the spacing between adjacent metal lines and the material used in the dielectric layers. At present, oxides having dielectric constants ranging from about 3.9 to 4.1 are used to form dielectric layers between metal lines of a semiconductor device.

SUMMARY OF THE INVENTION

Generally, the present invention relates to a semiconductor device and fabrication process in which tapered conductive lines are formed. Consistent with one embodiment of the invention, a semiconductor device is formed by forming at least one conductive structure over a substrate and forming an insulating layer over the conductive structure. The insulating layer is provided with one or more tapered grooves each of which are separated from the conductive structure by a portion of the insulating layer. In each tapered groove, a conductive line is formed. The conductive line may, for example, be a metal line. The conductive structures may, for example, be active regions of a transistor or a previously formed conductive line. A portion of the insulating layer between adjacent conductive lines may be a low dielectric material.

A semiconductor device consistent with an embodiment of the invention includes a substrate having at least one conductive structure formed over the substrate, and an insulating layer having one or more tapered grooves disposed over the conductive structure and separated from the conductive structure by a portion of the insulating layer. Disposed in at least a portion of each of the tapered grooves is a tapered conductive line. The tapered conductive line may, for example, be a metal line.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
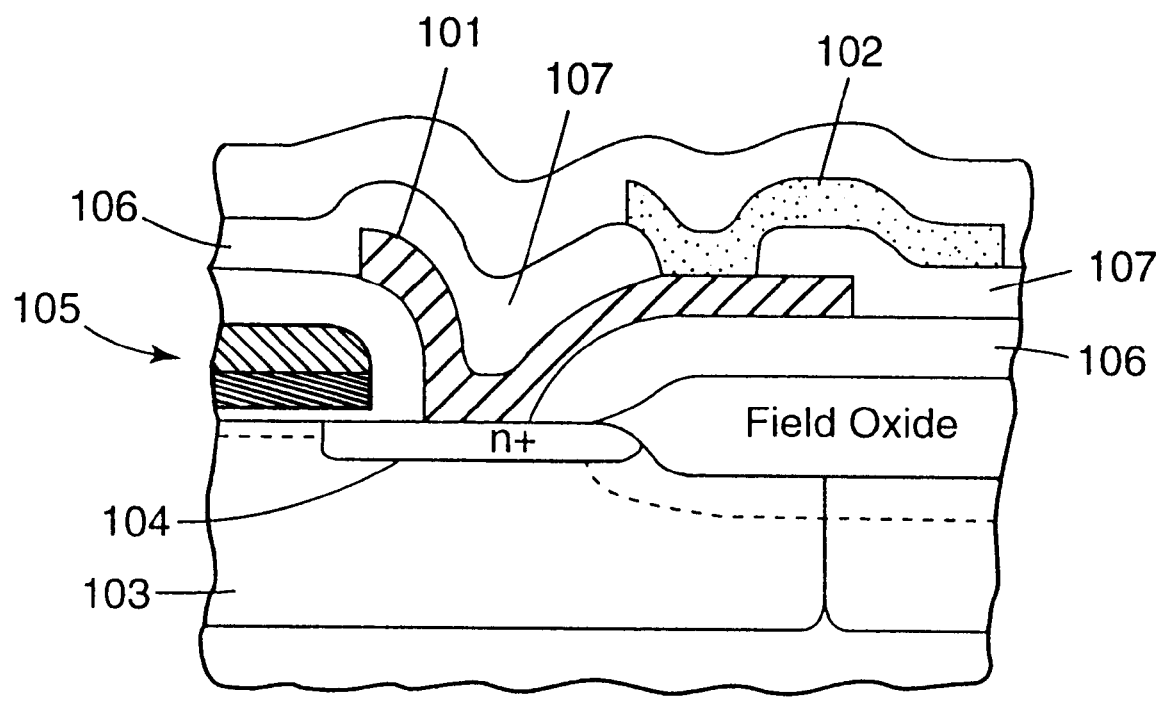
FIG. 1 illustrates an exemplary conventional multilayer interconnect structure for a MOS semiconductor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention generally provides a method of forming tapered conductive lines of a semiconductor device. The present invention is applicable to a number of semiconductor devices including, for example, MOS, bipolar, and BiCMOS transistors. While the present invention is not limited to such devices, an appreciation of various aspects of the invention will be gained through a discussion of various fabrication processes and device characteristics in connection with the examples provided below.

FIGS. 2A–2E illustrate a fabrication process in accordance with one particular embodiment of the invention. This particular process illustrates the formation of tapered conductive lines over active regions of a transistor. The invention, however, extends to cover the formation of tapered conductive lines at any level of the semiconductor structure. While the tapered conductive lines are typically metal lines formed from a metal such as tungsten or aluminum, the invention is not so limited. Tapered conductive lines formed of other conductive material, such as doped polysilicon, for example, are intended to fall within the scope of the invention.

Figure 2A:
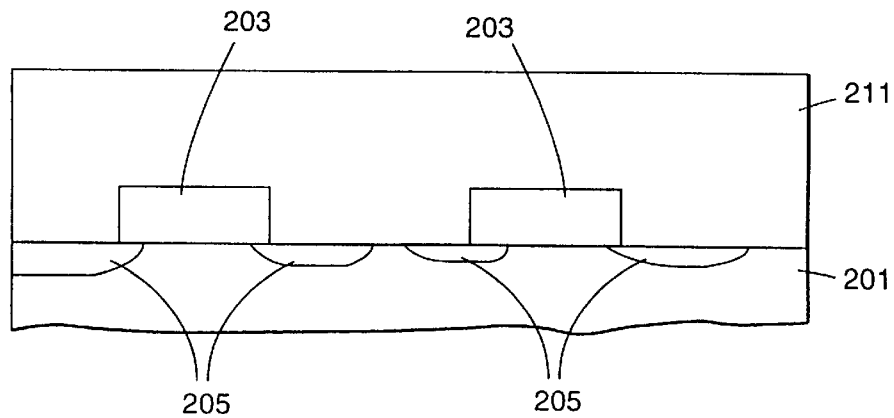
FIGS. 2A–2E illustrate an exemplary fabrication process in accordance with one embodiment of the invention.

In FIG. 2A, an insulating layer 211 is formed over a substrate 201. The substrate is typically a silicon substrate on which transistors have been formed. By way of example and not of limitation, MOS transistors having gate electrodes 203 and source/drain (S/D) regions 205 are illustrated. However, as noted above, the invention is applicable to a number of transistor types. The insulating layer 211 may, for example, be an oxide formed using well-known deposition techniques. In other embodiments, the insulating layer 211 may, for example, be formed from other dielectric materials or may be a composite film including one or more dielectric materials. The insulating layer 211 is generally used to insulate the gate electrodes 203 and S/D regions 205 from subsequently formed conductive lines (conductive lines 221 are illustrated in FIG. 2D). The thickness of the insulating layer 211 may be suitably selected in consideration of the desired spacing between the device transistors and the subsequently formed conductive lines. Suitable thicknesses of the insulating layer 211 range from about 5,000 to 20,000 Å for many applications.

Figure 2B:
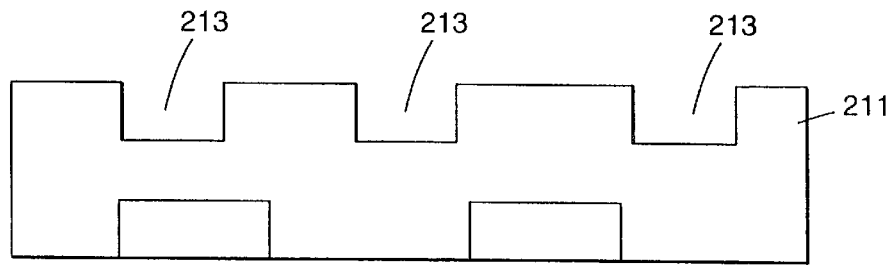

Portions of the insulating layer 211 are removed to form trenches 213, as illustrated in FIG. 2B. The trenches 213 may be formed by masking and etching the insulating layer 211 using, for example, well-known photolithography techniques. The trenches 213 will be used as a pattern to define conductive lines, as discussed below. Suitable depths of the trenches 213 range from about 1,000 to 5,500 Å.

Figure 2C:
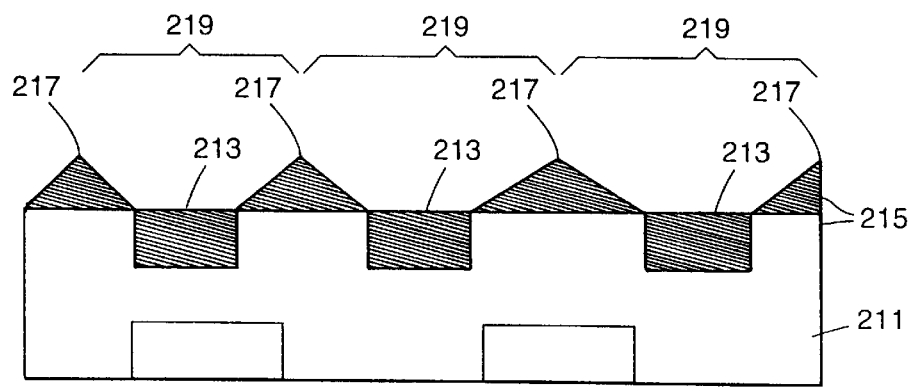
Figure 2D:
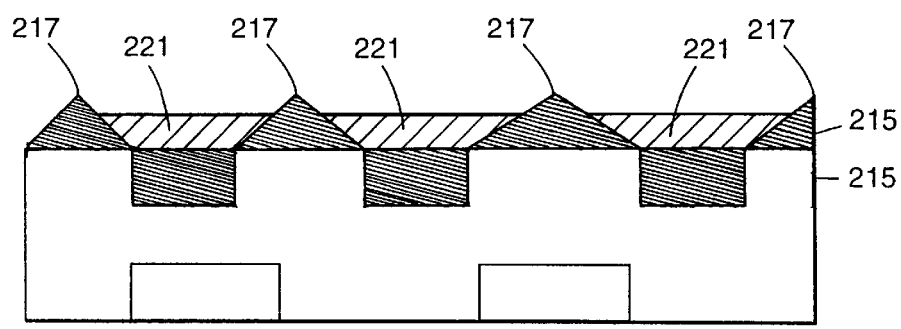

A second insulating layer 215 is formed over the insulating layer 211 to at least partially fill the trenches 213 and form tapered structures 217 over the elevated portions of the insulating layer 211 adjacent the trenches 213. The resultant structure is illustrated in FIG. 2C. While the invention is not limited to the techniques used to form the structure of FIG. 2C, in one particular embodiment the second insulating layer 217 is formed using a high-density plasma (HDP) deposition technique. This iterative deposition and etching technique generally fills the trenches 213 and forms the tapered structures 217 adjacent the trenches 213.

The tapered structures 217 are typically pyramid-like in shape having tapered edges which are angled with respect to the substrate surface. Adjacent tapered structures 217 generally form tapered grooves 219 used to form tapered conductive lines, as will be discussed below. The angles of the tapered edges and the depth of the tapered structures 217 will vary with the spacing between adjacent trenches 213. Typical angles of the tapered edges range from about 30 to 450°, while tapered structure depths of about 1½ times the depth of the trenches would be suitable for many applications.

The insulating layer 215 may be formed from a number of different dielectric materials including, for example, an oxide such as silicon dioxide. In one particular embodiment, the second insulating layer 215 is formed from a relatively low permativity material having a lower dielectric constant than that of oxides. For example, the insulating layer 215 may have a dielectic constant less than 3.9. In other embodiments, the insulating layer 215 may have a dielectric constant less than 3.5. In yet other embodiments, the insulating layer 215 may have a dielectic constant ranging from about 2.0 to 3.5.

The relatively low permativity material may be formed from a wide variety of materials which are non-caustic to the conductive layers. While the present invention is not so limited, suitable low permativity materials include films, such as hydrogen silsesquioxane, for example, and plastic type polymers such as poly-phenylquinoxaline, polyquinoline, and methylsilsesquixane polymer, for example. Plastic type polymers typically have dielectric constants ranging from about 2.0 to 3.5, for example. The use of a relatively low permativity material reduces capacitance between adjacent conductive lines and improves device performance.

The grooves 219 formed between adjacent tapered structures 217 are then at least partially filled with a conductive material to form conductive lines 221. The resultant structure is illustrated in FIG. 2D. By way of example, the conductive material may be a metal. In one embodiment, conductive metal lines are formed by providing a metallization layer over the second insulating layer 215 and removing a portion of the metallization layer to form the structure illustrated in FIG. 2D. Formation and removal of a metallization layer may be done using, for example, well-known deposition and polishing techniques. Advantageously, the tapered edges of the tapered structures 217 provide a convenient polishing stop for the polishing process. While the invention is not so limited, suitable metals include aluminum and tungsten, for example.

Figure 2E:
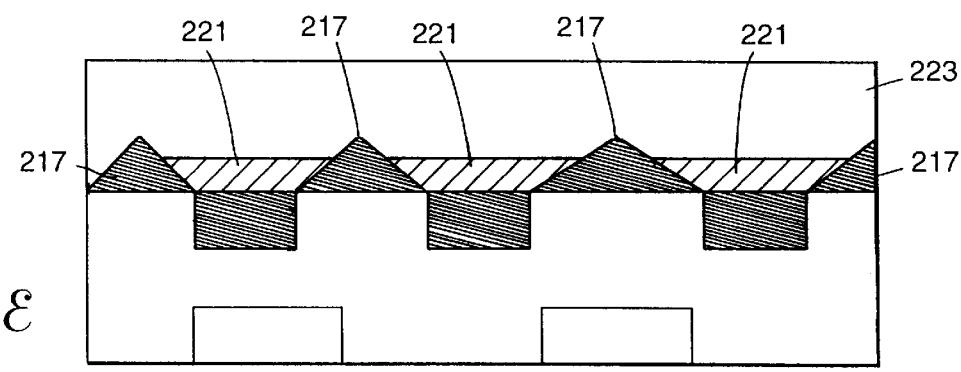

Fabrication of the semiconductor may continue with the formation of an insulating layer 223 over the conductive lines 221 and tapered structures 217. The resultant structure is illustrated in FIG. 2E. The insulating layer 221 may, for example, be a passivation layer or an intermediate dielectric layer used for separating conductive lines 221 from those of a subsequently formed conductive layer. In the latter instance, the insulating layer 223 may be used in a similar fashion as insulating layer 211 of FIG. 2B to form the subsequent conductive lines.

Using the above fabrication process, improved conductive lines, such as metal lines, for semiconductor devices can be formed. In particular, using the above process, tapered conductive lines having larger footprints on their upper surface than their lower surfaces. The smaller surface footprint allows for further increases in the packing density of semiconductor devices to be increased, while the larger upper surface footprint provides a suitably large base for subsequent contacts. The tapered edges further reduce the spacing between adjacent conductive lines and thereby reduce capacitance between the lines and thus improve device performance. Device performance can further be improved by incorporating relatively low permativity material between the conductive lines in the fabrication process.

While the above-described process generally illustrates a process for forming a conductive layer with tapered conductive lines over an active region of a MOS transistor, the present invention is not so limited. For example, as noted above, the above process may be used to form tapered conductive lines at any level of a semiconductor device. Furthermore, a number of different semiconductor devices, such as, for example, MOS, bipolar, and BiCMOS devices, can benefit from the present invention.

Figure 3A:
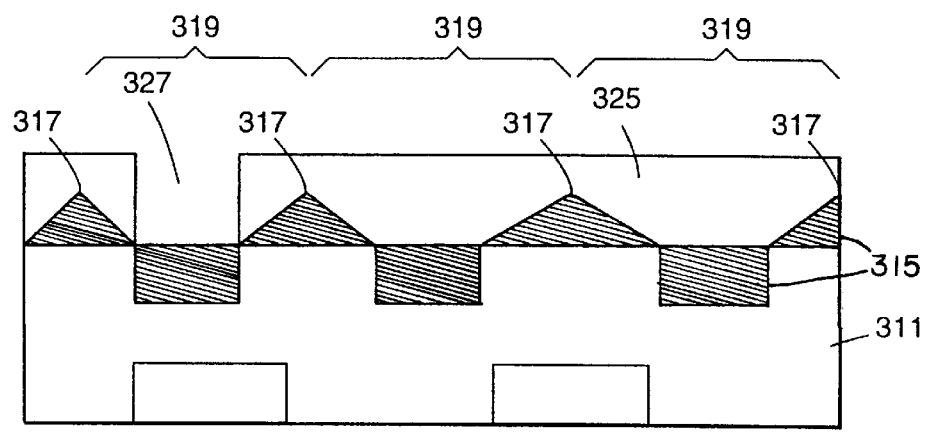
FIGS. 3A–3C illustrate another exemplary fabrication process in accordance with an another embodiment of the invention.
Figure 3B:
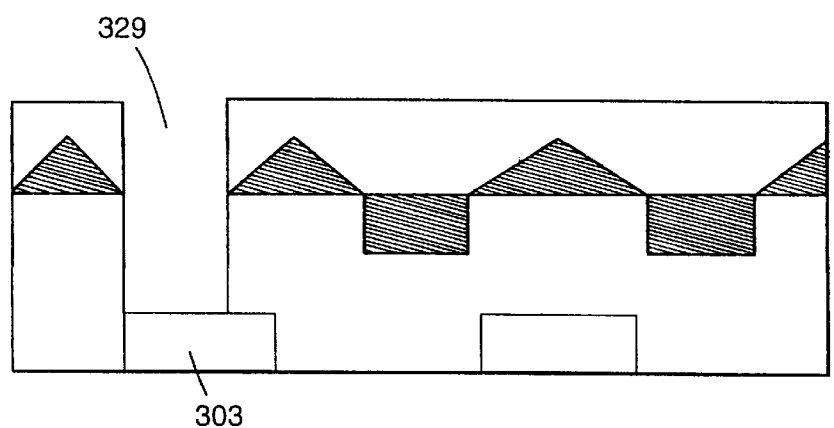
Figure 3C:
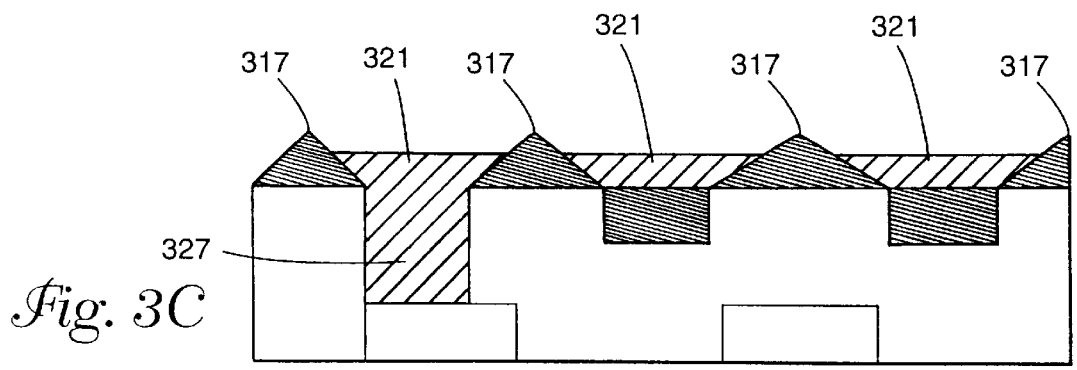

Interconnection of tapered conductive lines with previously formed conductive structures, such as gate electrodes, S/D regions, or previously formed conductive lines, may be done in a variety of manners. While the present invention is not so limited, an exemplary process for interconnecting tapered conductive lines with conductive structures is illustrated in FIGS. 3A–3C. In accordance with this embodiment, an insulating layer 315 having tapered grooves 319 between tapered structures 317 (similar to the structure of FIG. 2C) is fabricated using, for example, the process described with respect to FIGS. 2A–2C above. A mask 325 is formed over the grooves 319 and tapered structures 317 and openings (only one of which is shown, opening 327) are formed in the mask 325 to expose portions of the insulating layer 315. The resultant structure is illustrated in FIG. 3A.

The exposed portions of insulating layer 315 as well as underlying portion of insulating layer 311 are removed to form vias (only one of which, via 329, is shown) which expose underlying conductive portions, such as the gate electrode 303. The resultant structure is illustrated in FIG. 3B. The formation of mask 325 and removal of insulating layers 315 and 311 may be done using, for example, well-known photolithography and etching techniques.

The mask 325 may be removed and a conductive layer, such as a metallization layer may be formed over the structure. A portion of the metallization layer may be removed to form tapered conductive metal lines 321 and contact structure (only one of which, contact structure 327, is shown). The resultant structure is illustrated in FIG. 3C. Removal of the metallization layer may, for example, be performed by polishing, as discussed above. It should be appreciated that, in other embodiments, the metal lines 321 and contact structure 327 may be formed using a dual metal deposition process. For example, a first metal layer may be formed over the structure and removed to form metal contacts 327. A second metallization layer may then be formed over the resultant structure and polished to stop on the tapered edges of the tapered structures 317 in order to form the metal lines 321.

As noted above, the above-described process for forming contacts between conductive lines and previously formed conductive structures is exemplary only. Those skilled in the art will readily recognize that other processes may be used for connecting tapered conductive lines to previously formed conductive structures. For example, the structure illustrated in FIG. 2D may be masked to expose at least a portion of conductive lines 221 (and insulating layer 215 if desired). The exposed portions of the conductive lines 221 (as well as any exposed portion of the second insulating layer 215 and the insulating layer 211 beneath may be removed down the earlier-formed conductive structures to form vias thereto. These vias may then be filled with a metal or other conductive material to form contacts between the conductive lines and the conductive structures. In yet other embodiments, contact openings or vias to earlier-formed conductive structures may be formed in the insulating layer 211 of FIGS. 2B or 2C and filled with a conductive material to form plugs. These plugs may be contacted by the tapered conductive lines.

As noted above, the present invention provides a semiconductor device and a method of fabricating a semiconductor device having tapered conductive lines. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A method of fabricating a semiconductor device, comprising:

forming at least one conductive structure over a substrate;

forming an insulating layer over the conductive structure, the insulating layer having one or more tapered grooves each having a bottom surface separated from the conductive structure by a portion of the insulating layer; and forming one or more conductive lines, each of the one or more conductive lines being formed in a respective one of the one or more tapered grooves, each of the one or more conductive lines having a lower surface adjacent the bottom surface of the respective one of the one or more tapered grooves;

wherein forming the insulating layer includes:

forming a first insulating layer;

removing portions of the first insulating layer to form the one or more trenches therein, each of the one or more trenches defining a pattern for a respective one of the one or more conductive lines; and forming a second insulating layer over the first insulating layer and the one or more trenches, the second insulating layer filling at least a portion of each of the one or more trenches to form the bottom surface of the one or more tapered grooves and forming tapered structures over portions of the first insulating layer adjacent each of the one or more trenches to define sidewalls of the one or more tapered grooves.

2. The method of claim 1, wherein the second insulating layer is formed using an interative deposition and etching plasma deposition technique.

3. The method of claim 1, wherein the first insulating layer is formed from an oxide.

4. The method of claim 1, wherein the one or more conductive lines are metal lines.

5. The method of claim 1, wherein the conductive structure is an active region of a transistor.

6. The method of claim 1, wherein the one or more tapered grooves have tapered surfaces having an angle with respect to a substrate surface ranging from about 30 to 45°.

7. The method of claim 1, further including forming, after forming the tapered structures, at least one via in the insulating layer for connecting the one or more conductive lines to the conductive structure.

8. The method of claim 1, wherein the second insulating layer is formed from a low permittivity material relative to oxide.

9. The method of claim 2, wherein forming the one or more conductive lines includes:

depositing a metal over the second insulating layer; and removing the metal to form a tapered metal line in each of the one or more tapered grooves.

10. The method of claim 1, wherein the one or more trenches have a depth of about 1000 to 5500 Angstroms.

11. The method of claim 10, wherein the tapered structures have a depth of about 1 to 1.5 times the depth of the one or more trenches.

12. The method of claim 8, wherein the low permittivity material has a dielectric constant less than 3.9.

13. The method of claim 8, wherein the low permittivity material has a dielectric constant less than 3.5.

14. The method of claim 8, wherein the low permittivity material is a plastic type polymer.

15. The method of claim 9, wherein removing the metal includes polishing the metal using edges of the one or more tapered grooves as a polish stop to form a planar top surface, for each tapered metal line, abutting adjacent tapered structures.

16. The method of claim 7, wherein the conductive structure is a metal line.

17. A method of fabricating a semiconductor device, comprising:

forming an oxide layer over a substrate;

removing portions of the oxide layer to form trenches therein;

forming a low permittivity layer, having a dielectric constant lower than that of oxide, over the oxide layer and the trenches, the low permittivity layer filing at least a portion of each of the trenches and forming tapered structures over portions of the oxide layer adjacent the trenches, the tapered structures defining tapered grooves; and forming a metal line having tapered edges in each of the tapered grooves.

18. The method of claim 17, wherein the portions of the oxide layer adjacent the trenches are planar.

19. The method of claim 17, wherein each metal line has a planar top surface abutting two of the tapered structures.

20. A method of fabricating a semiconductor device, comprising:

forming a first insulating layer over a substrate;

removing portions of the first insulating layer to form trenches therein;

forming a second insulating layer over the first insulating layer and the trenches, the second insulating layer filling at least a portion of each of the trenches and forming tapered structures over raised portions of the first insulating layer adjacent the trenches, the tapered structures defining tapered grooves; and forming a conductive line having tapered edges in each of the tapered grooves.

21. The method of claim 20, wherein the raised portions of the first insulating layer adjacent the trenches are planar.

22. The method of claim 20, further including removing portions of the second insulating layer and underlying portions of the first insulating layer, after forming the tapered structures, to form at least one via for an underlying conductive structure.

23. A method of fabricating a semiconductor device, comprising:

forming at least one conductive structure on a substrate;

forming an insulating layer over the conductive structure, removing portions of the insulating layer to form at least one trench defining a pattern for a tapered groove;

depositing an insulating material over the insulating layer and the trench, wherein the insulating material at least partially fills the trench to form a bottom surface of the tapered groove separating the tapered groove from the conductive structure and wherein the insulating material forms tapered structures, over portions of the insulating layer adjacent the trench, which define sidewalls of the tapered groove; and forming a conductive line in the tapered groove, separated from the conductive structure by the insulating material.

24. The method of claim 23, wherein depositing the insulating material includes iteratively depositing and etching the insulating material.

25. The method of claim 23, wherein depositing the insulating material includes completely filling the trench.

26. The method of claim 23, further including removing portions of the insulating material and underlying portions of the insulating layer, after forming the tapered structures, to form at least one via for the conductive structure.

27. The method of claim 23, wherein forming the conductive line includes forming a planar top surface of the conductive line abutting the tapered structures.

28. The method of claim 23, wherein the insulating layer has a planar top surface and removing portions of the insulating layer includes leaving planar surfaces of the insulating layer adjacent the trench.

29. The method of claim 28, wherein the tapered structures are formed over the planar surfaces of the insulating layer.

30. The method of claim 29, wherein the tapered structures have a triangular shape.

31. The method of claim 23, wherein forming the insulating layer includes depositing the insulating layer to a thickness greater than a thickness of the conductive structure.

32. The method of claim 31, wherein removing portions of the insulating layer includes forming the trench above the conductive structure so that the trench is separated from the conductive structure by a portion of the insulating layer.

* * * * *